United States Patent
Centanni et al.

(10) Patent No.: US 6,316,733 B1
(45) Date of Patent: Nov. 13, 2001

(54) COMPONENT FOR USE IN FORMING PRINTED CIRCUIT BOARDS

(75) Inventors: Michael A. Centanni, Parma; Mark Kusner, Gates Mills, both of OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/641,303

(22) Filed: Aug. 18, 2000

(51) Int. Cl.⁷ ........................................................ H05K 1/03
(52) U.S. Cl. ............................ 174/255; 174/256; 174/259
(58) Field of Search ...................... 174/255, 52.4, 174/256, 257, 258, 259, 261; 361/792, 793, 794, 795, 771, 779; 257/737, 738, 778, 780

(56) References Cited

U.S. PATENT DOCUMENTS

| | | | |
|---|---|---|---|
| 5,397,997 | * 3/1995 | Tuckerman et al. | 324/754 |
| 5,541,524 | * 7/1996 | Tuckerman | 324/754 |
| 6,059,952 | * 5/2000 | Kang et al. | 205/143 |
| 6,118,183 | * 9/2000 | Umehara et al. | 257/783 |
| 6,157,085 | * 12/2000 | Terashima | 257/783 |
| 6,199,273 | * 3/2000 | Kubo et al. | 29/843 |
| 6,201,305 | * 3/2001 | Darveaux et al. | 257/779 |

OTHER PUBLICATIONS

Metech, Inc. specification sheet entitled: METECH, Silver Conductor 2700, Revised Oct. 1999, 1 page.

Metech, Inc. specification sheet entitled: METECH, 8000 Series Resistor Compositions, Revised Nov. 1999, 1 page.

Information obtained from the web site: http://www.metechinc.com/solutions/clarostat.html, *SOLUTIONS* entitled: "Polymer Resistor Project Proves a 'win–win–win'," 4 pages, dated Jul. 20, 2000.

Information obtained from the web site: http://www.metechinc.com/solutions/manyapps.html, *SOLUTIONS* entitled: "Metech Resistor Pastes Serve Many Applications," 2 pages, dated Jul. 20, 2000.

* cited by examiner

*Primary Examiner*—Jeffrey Gaffin
*Assistant Examiner*—Jose' H. Alcala
(74) *Attorney, Agent, or Firm*—Mark Kusner; Michael A. Centanni

(57) ABSTRACT

A component for use in manufacturing printed circuits that in a finished printed circuit constitutes a functional element. The component is comprised of a film substrate formed of a first polymeric material having a first side and a second side. At least one layer of a tiecoat metal is applied to the first side of the film substrate. At least one layer of copper on the at least one layer of a tiecoat metal, the layer of copper having an essentially uncontaminated exposed surface facing away from the at least one layer of tiecoat metal. A plurality of spaced apart, adhesion promoting areas of a tiecoat metal are provided on the second side of the film substrate defining regions of exposed polymeric material on the second side of the film substrate.

13 Claims, 5 Drawing Sheets

COMPONENT FOR USE IN FORMING PRINTED CIRCUIT BOARDS

FIELD OF THE INVENTION

The present invention relates generally to printed circuits, and more particularly, to components used in the manufacturing of printed circuit boards and other articles.

BACKGROUND OF THE INVENTION

A basic component of a printed circuit board is a dielectric layer having a sheet of copper foil bonded thereto. Through a subtractive process, that includes one or more etching steps, portions of the copper foil are etched away to leave a distinct pattern of conductive lines and formed elements on the surface of the dielectric layer. Multi-layer printed circuit boards are formed by stacking and joining two or more of the aforementioned dielectric layers having printed circuits thereon.

The trend, in recent years, has been to reduce the size of electronic components and provide printed circuit boards having multi-chip modules, etc. This results in a need to increase the number of components, i.e., surface mount components, provided on a printed circuit board. A key to providing a densely populated circuit board is to produce close and fine circuit patterns from the copper. The width and spacing of conductive paths on the printed circuit board are generally dictated by the thickness of the copper on the dielectric layer.

It has been proposed to use copper-coated polyimide components in forming printed circuits. The thickness of the copper on polyimide is generally significantly less than the thickness of traditional copper foil sheet. The thinner copper on the polyimide allows for finer and more closely spaced circuit lines in that the thinness of the copper layer reduces the etching time required to remove unwanted copper. In this respect, it is possible to use copper clad polyimide wherein the copper has a thickness as low as 0.1 µm (1,000 Å). The thinner copper on the polyimide also finds advantageous application in a semi-additive process. In a semi-additive process, the copper is masked to define a circuit pattern, and copper is plated onto the exposed pattern to build up a circuit. The mask material is removed and a "flash etch" removes the base copper on the polyimide leaving the built-up circuit on the polyimide. Thus, copper on polyimide finds advantageous application in both subtractive and semi-additive processes for forming printed circuits.

The use of copper-coated polyimide components in forming printed circuit boards or multi-layer laminates requires good adhesion between the polyimide side of the component and the inner core laminate to which it is attached. However, it is generally known that polyimide itself has relatively poor adhesion properties.

The present invention overcomes this and other problems, and provides a copper-coated polyimide component having improved adhesion with the inner core laminate.

SUMMARY OF THE INVENTION

In accordance with a preferred embodiment of the present invention, there is provided a component for use in manufacturing printed circuits that in a finished printed circuit constitutes a functional element. The component is comprised of a film substrate formed of a first polymeric material having a first side and a second side. At least one layer of a tiecoat metal is applied to the first side of the film substrate. At least one layer of copper is deposited on the at least one layer of a tiecoat metal, the layer of copper having an essentially uncontaminated exposed surface facing away from the at least one layer of tiecoat metal. A plurality of spaced apart, discrete, adhesion promoting areas of a tiecoat metal are formed on the second side of the film substrate to define region(s) of exposed polymeric material on the second side of the film substrate.

It is an object of the present invention to provide a copper-coated polyimide component for use in forming printed circuit boards, multi-layer laminates and the like.

It is another object of the present invention to provide a copper-coated polyimide component as described above having improved adhesion to an inner core laminate.

It is another object of the present invention to provide a copper-coated polyimide component as described above having an adhesion promoting layer on the polyimide side of the component.

It is another object of the present invention to provide a copper-coated polyimide component as described above wherein the adhesion promoting layer is comprised of a plurality of spaced apart, discrete areas defining region(s) of exposed polyimide.

It is a still further object of the present invention to provide a copper-coated polyimide component as described above that would accommodate through holes.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
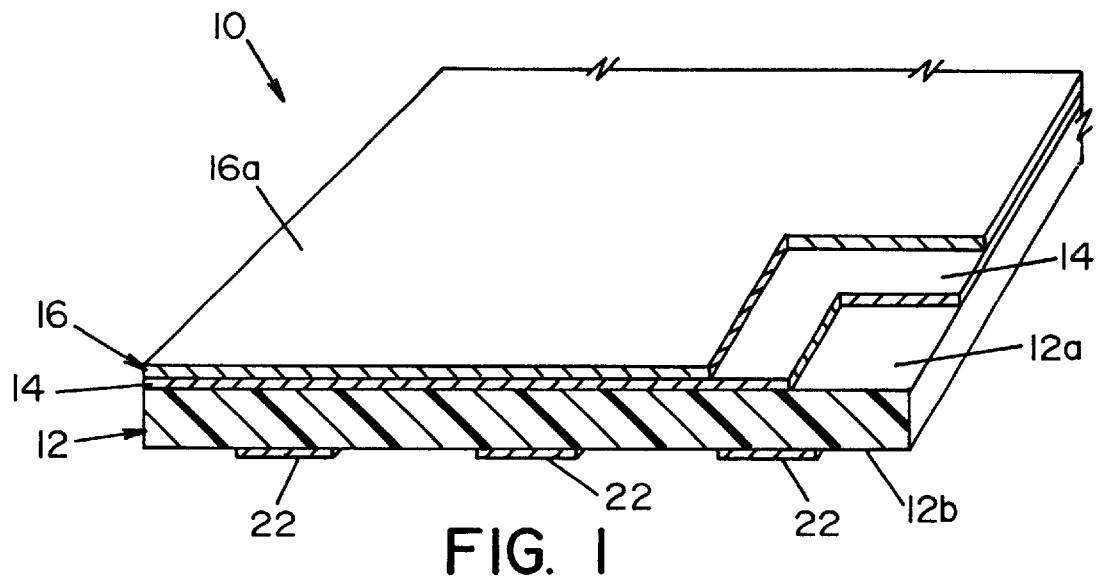
FIG. 1 is a top, perspective view of a component for use in forming printed circuit boards and multi-layer laminates, illustrating a preferred embodiment of the present invention.

Referring now to the drawings wherein the showings are for the purpose of illustrating preferred embodiments of the invention only, and not for the purpose of limiting same, FIG. 1 shows a component 10 for use in manufacturing articles such as printed circuit boards, illustrating a preferred embodiment of the present invention.

Broadly stated, component 10 is comprised of a film substrate 12 formed of a first polymeric material. Substrate 12 has a first side 12a and a second side 12b. At least one flash layer 14 of a tiecoat metal (conventionally referred to as a "tiecoat") is applied to first side 12a of film substrate 12. A layer 16 of copper is applied onto flash layer 14. An adhesion promoting material is provided on second side 12b of film substrate 12. Component 10 is adapted to be a functional element in a finished printed circuit. In this respect, copper layer 16 would be processed so as to form printed circuit patterns on film substrate 12.

Polymeric film 12 is preferably formed of a polyimide and has a thickness of between 12.5 μm and 125 μm. Specific examples of materials that may form polymeric film 12 include Kapton-E or Kapton-HN (manufactured by I.E. DuPont) Upilex-S or Upilex-SGA (manufactured by Ube) and Apical NP (manufactured by Kaneka).

Tiecoat layer 14 may be formed from metals from the group consisting of chromium, nickel, titanium, aluminum, molybdenum, tantalum, gold, tin, indium, vanadium, silicon, iron, copper and alloys thereof. Tiecoat layer 14 preferably has a thickness of between 0 Å (none) and 500 Å, and more preferably, between about 50 Å0 to 300Å.

Copper layer 16 preferably has a thickness of between about 0.1 μm (1000 Å) and 70 μm. Layer 16 will generally be formed of a flash layer of copper (not shown) onto which a relatively thicker layer of copper is deposited. Layer 16, as referred to hereinafter and as shown in the drawings, is intended to describe the total thickness of the copper layer that is on the tiecoat flash layer 14. The copper forming copper layer 16 may be applied by vacuum metallization, electrodeposition, electroless deposition or combinations thereof. Depending upon the thickness of copper layer 16, the major portion of copper layer 16 is preferably applied by an electrodeposition process or by vacuum metallization. Methods of vacuum metallization include thermal evaporation, sputtering and e-beam deposition. Copper layer 16 has an exposed surface, designated 16a in the drawings that is essentially uncontaminated. As used herein, the term "uncontaminated" shall refer to the surface 16a of copper layer 16 being free from dust, grease, oil, resin particles and other like materials that are deleterious when present on the copper to the formation of a printed circuit by either a subtractive process or a semi-additive process. Surface 16a may include a surface treatment typically applied to the copper to promote adhesion of a dielectric substrate or to provide other properties and still be "uncontaminated" as used herein. Surface 16a of copper layer 16 may be treated or untreated without deviating from the present invention.

As indicated above, the overall thickness of copper layer 16 may vary between about 0.1 μm (1000 Å) and 70 μm. Copper thicknesses at the lower side of this range, i.e., about 0.1 μm, would typically be applied by a vacuum metallization process and find application in a semi-additive process as heretofore described. Copper thicknesses of about 5 μm and above may be applied by an electrodeposition process, or by a combined process involving vacuum metallization and electrodeposition. Copper thicknesses of about 5 μm and above may be processed in a number of ways (including a semi-additive process), whereas copper having a thickness of about 18 μm and above, would typically find application in a subtractive process, as described above.

Referring now to second side 12b of film 12, an adhesion promoting material is applied thereto to promote adhesion of component 10 to a substrate, as shall be described in greater detail below. The adhesion promoting material is preferably formed of a metal selected from the group consisting of chromium, nickel, titanium, aluminum, molybdenum, tantalum, gold, tin, indium, vanadium, silicon, iron, copper and alloys thereof In this respect, the adhesion promoting material is preferably formed of the same metals used to form tiecoat layer 14.

Figure 2:
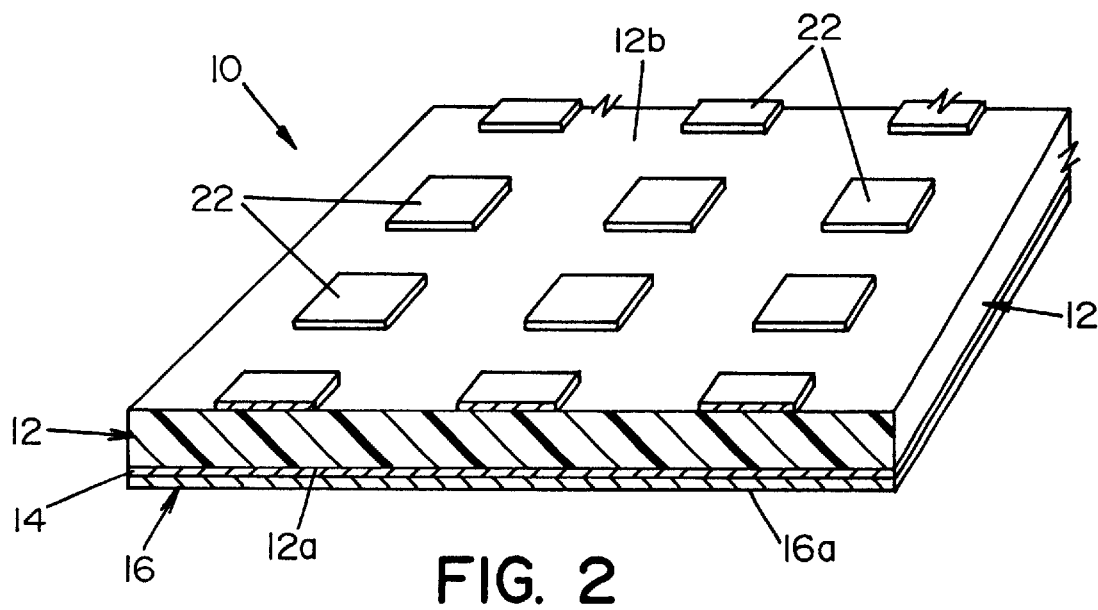
FIG. 2 is a bottom, perspective view of the component shown in FIG. 1.

In a preferred embodiment, the adhesion promoting material is disposed on surface 12b as a plurality of discrete, spaced-apart areas 22, as best seen in FIG. 2. In the embodiment shown in FIGS. 1–4, areas 22 are squares that are equally spaced and uniformly sized. It will be appreciated from a further reading of the specification, that areas 22 may assume shapes other than square, such as rectangular, circular, triangular and the like, and may be irregular in size, shape and spacing. Areas 22 preferably have a thickness between about 50 Å to about 300 Å. As best seen in FIG. 2, contiguous region(s) of surface 12b of polyimide film 12 are left exposed by adhesion promoting areas 22.

Figure 3:
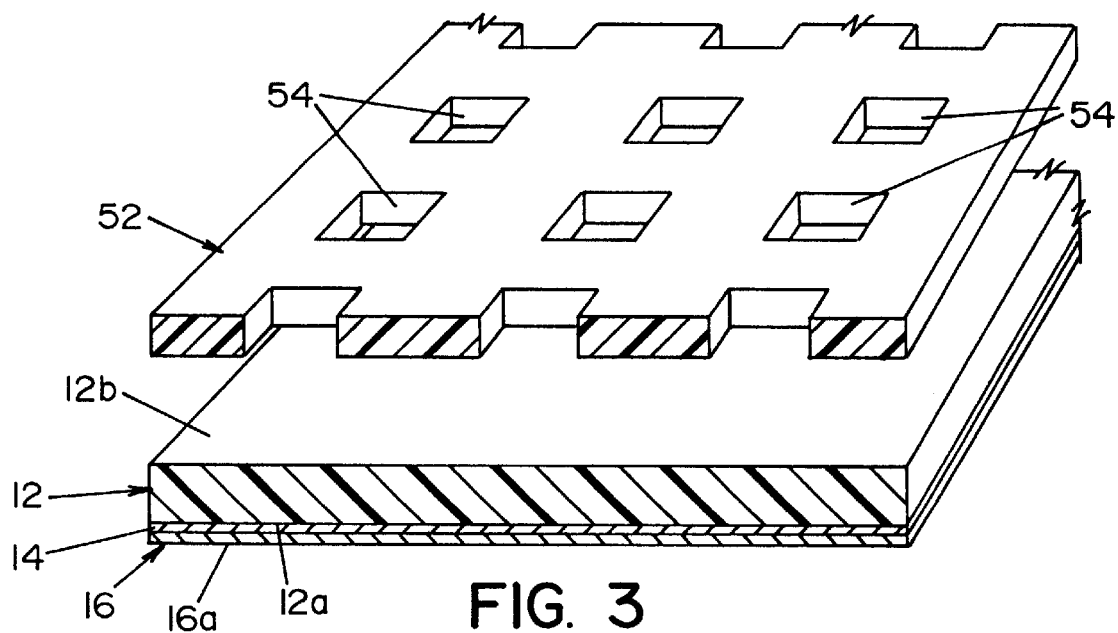
FIG. 3 is a perspective view showing a mask used in forming the component shown in FIGS. 1 and 2.
Figure 4:
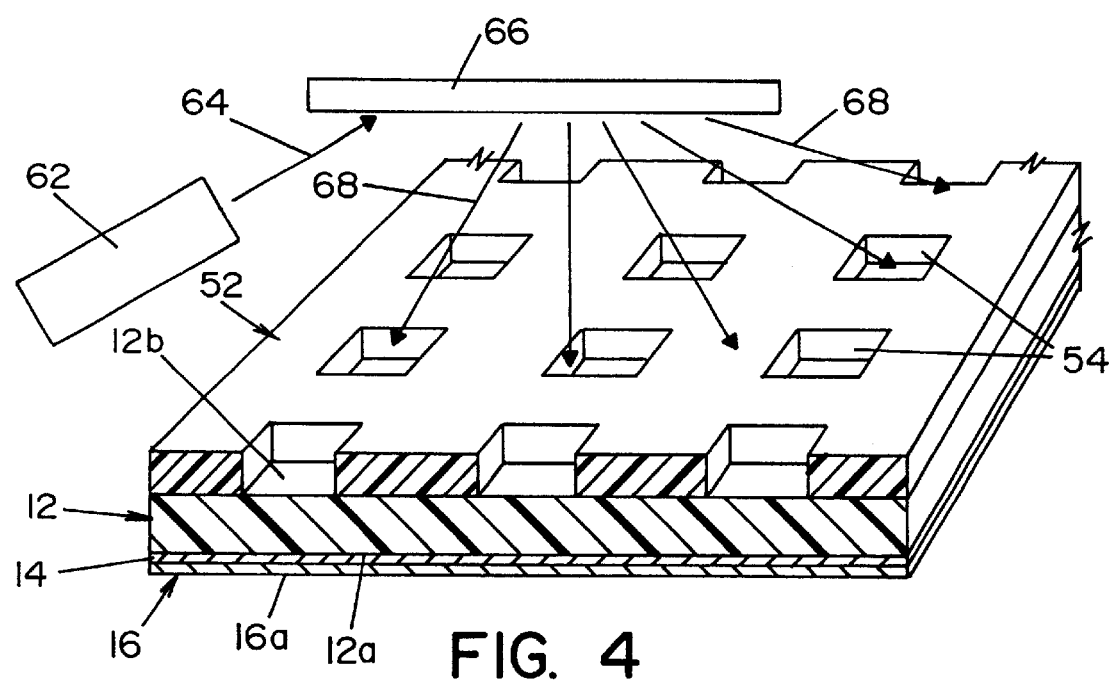
FIG. 4 is a perspective view illustrating a metal deposition process for forming the component shown in FIGS. 1 and 2.

Adhesion promoting areas 22 are formed on second side 12b of polymeric film 12 by a deposition process, such as vacuum metallization, electrodeposition or combinations thereof. In the embodiment shown, a sputter deposition process is used. A mask 52, best seen in FIG. 3, is used to form adhesion promoting areas 22. Mask 52 may be formed of a paper, or as shown in FIG. 3, of a polymeric material. Mask 52 has openings 54 formed therethrough. Openings 54 conform to the desired shape of adhesion promoting areas 22. Mask 52 is placed over, i.e., onto, second side 12b of polymeric film 12. An electron beam gun 62, schematically shown in FIG. 4, directs a stream of electrons 64 at a target 66, that is comprised of the metal that is to be deposited. Metal atoms and agglomerates, designated 68 in FIG. 4, liberated by electron beam 64 are deposited onto second side 12b of film 12 through openings 54 in mask 52 to define adhesion promoting areas 22. When mask 52 is removed, a pattern of adhesion promoting areas 22, as shown in FIG. 2, is provided.

Component 10 is adapted for use in forming a printed circuit board, a multilayer printed circuit board, a multilayer laminate or the like. Specifically, component 10 is adapted to be secured to a core. (Throughout this specification, the use of the term "core" is meant to include any one of a variety of core materials, all of which may be reinforced or non-reinforced and may include an epoxy, polyester, polyimide, a polytetrafloroethylene, and in some applications, a core material which includes previously formed printed circuits). Adhesion promoting areas 22 are adapted to enhance the adhesion of film 12 to the core. The core may be circuitized and have circuit trace lines formed on the exposed surface thereof. An adhesive is disposed between such circuit trace lines on the core and component 10. Component 10 is placed upon the core with adhesion promoting areas 22 facing the adhesive and the core. Using conventionally known laminating techniques, component 10 is secured to the core, leaving copper layer 16 exposed for circuitizing as the outermost layer of a multi-layer circuit board. It is conventionally known to connect circuit trace lines on the outer surface to circuit trace lines embedded within the multi-layer printed circuit by means of "through holes."

Figure 7:
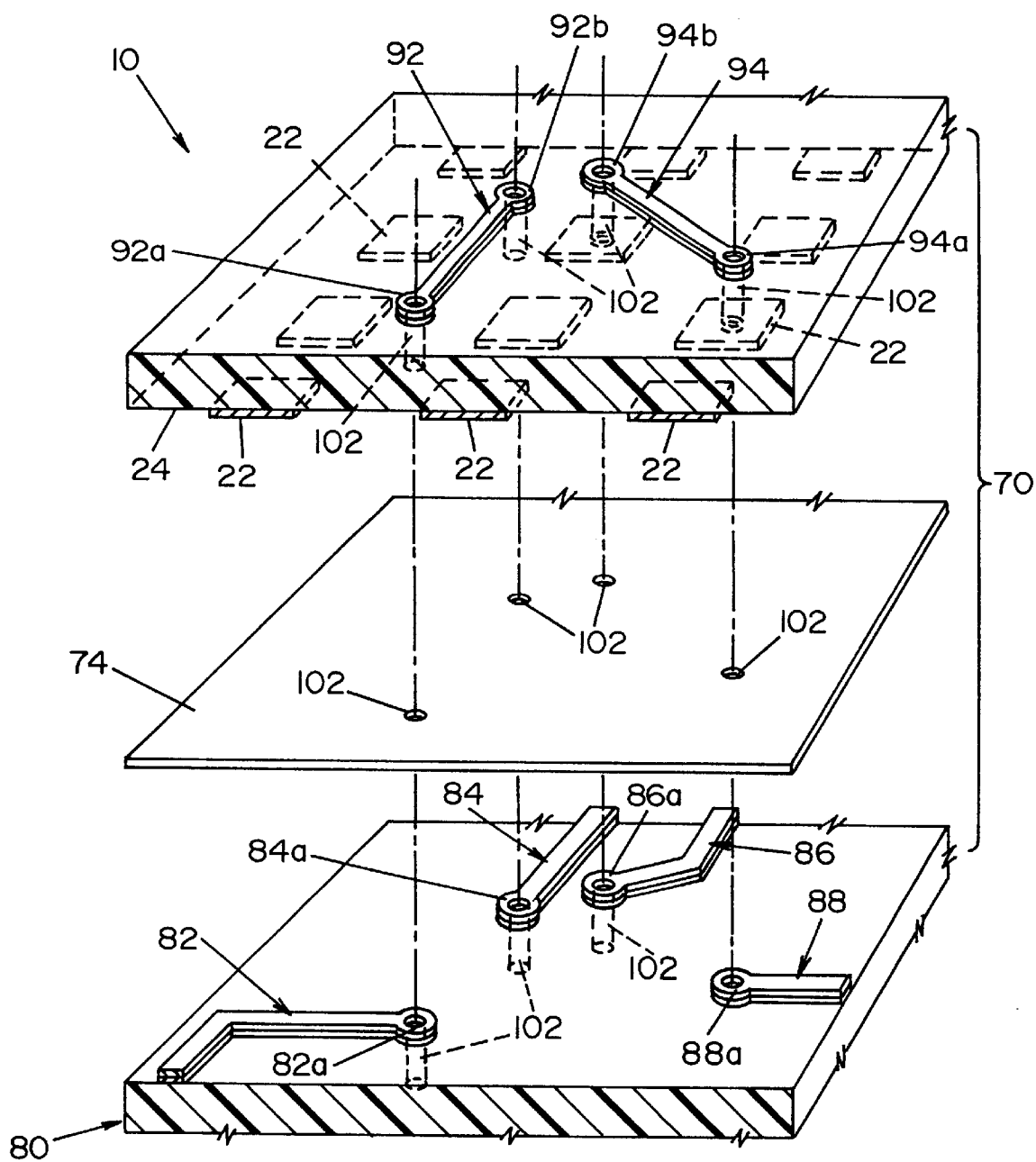
FIG. 7 is an exploded view of a portion of a printed circuit board, showing the component shown in FIG. 1 with trace lines formed thereon.

FIG. 7 illustrates component 10 as part of a multi-layer printed circuit board 70, wherein component 10 is an outermost section of the printed circuit board and is attached to a core 80. FIG. 7 is shown exploded to illustrate more clearly the respective elements. Only a portion of core 80 is shown in FIG. 7. Core 80 may be formed from one or more previously formed printed circuit laminates, wherein each printed circuit laminate is comprised of an inner core having circuit leads or connectors formed on the outer surfaces thereof.

In FIG. 7, an inner core 80 having circuit trace lines designated 82, 84, 86 and 88 thereon, is shown.

A layer of adhesive 74 is disposed between core 80 and component 10. Adhesion promoting areas 22 enhance the adhesion of component 10 to core 80. Component 10 has been circuitized to have trace lines 92, 94 thereon. The respective components shown in FIG. 7 are laminated together using conventionally known techniques. FIG. 7 illustrates how ends 92a, 92b, 94a and 94b of circuit trace lines 92, 94 may be connected to ends 82a, 84a, 86a and 88a of trace lines 82, 84, 86 and 88, by means of through holes designated 102 (shown in phantom in FIG. 7). As will be appreciated, through holes 102 are drilled through the respective layers after their assembly and lamination. Trace line 92 on component 10 is oriented to be connected to trace lines 82, 84 on core 80. As shown in FIG. 7, through holes 102 that connect trace line 92 to trace lines 82, 84 extend through region 24 where no adhesion promoting area(s) 22 exists, i.e., through holes 102 do not intersect with adhesion promoting areas 22. Trace line 94 on component 10 is disposed to be connected to ends 86a, 88a of trace lines 86, 88 on core 80. Each through hole 102 that connects trace line 94 to trace lines 86, 88 extends through an adhesion promoting area 22, as shown in FIG. 7. In this respect, since adhesion promoting areas 22 are isolated from each other, and only one through hole 102 extends through each area 22, no short circuit condition exists.

The present invention thus illustrates how component 10 may be used to enhance adhesion of a polymeric material to a substrate without interfering with through hole connections between the respective layers of a multi-layer printed circuit board. It will, of course, be appreciated that adhesion promoting areas 22 must be dimensioned in conjunction with the trace line patterns such that one and only one through hole 102 penetrates an adhesion promoting area 22 to avoid a short circuit condition.

Figure 5:
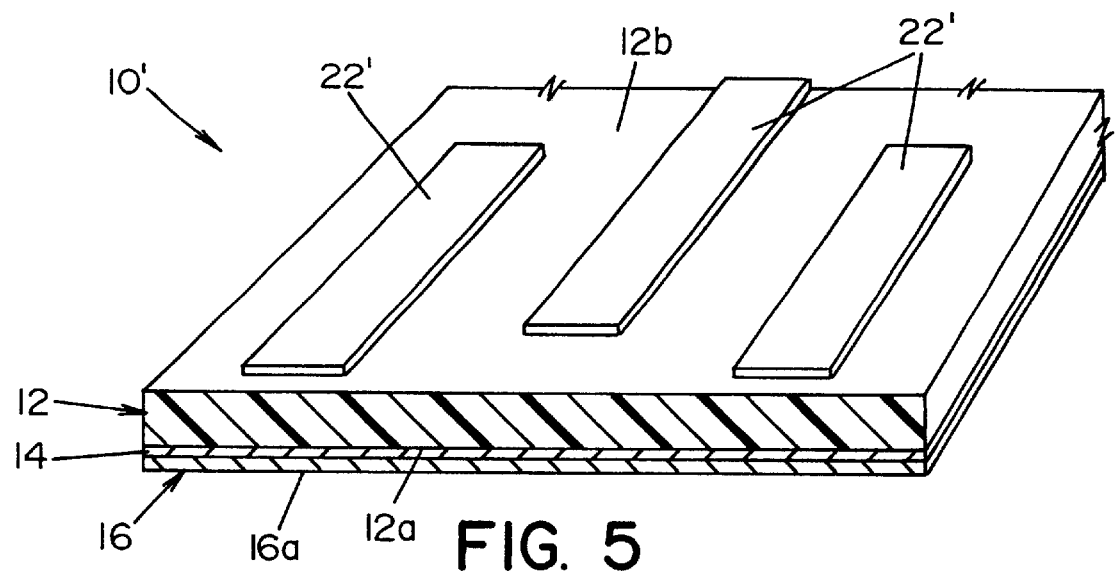
FIG. 5 is a bottom, perspective view of a component for use in forming printed circuit boards and multi-layer laminates, illustrating another embodiment of the present invention.

FIGS. 1–4 show a component 10 formed to have a plurality of discrete, spaced apart adhesion promoting areas 22 formed by a mask pattern. As will be appreciated by those skilled in the art, other shapes and patterns may be formed using a reusable mask or using a masking material that is etched away. For example, FIG. 5 shows a component 10' illustrating an alternate embodiment of the present invention, wherein adhesion promoting areas, designated 22', are shown in the form of staggered strips. This type of configuration may also be formed by using a reusable mask, or by using a masking material that is later dissolved away following an electrodeposition process to apply adhesion promoting material to side 12b of film 12.

Figure 6:
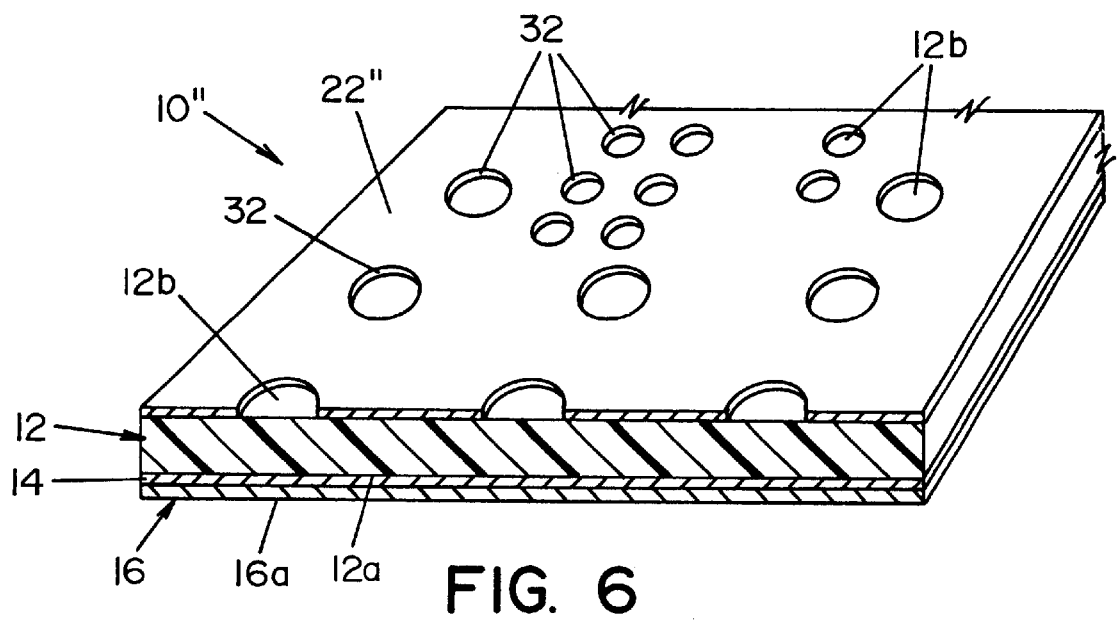
FIG. 6 is a bottom, perspective view of a component for use in forming printed circuit boards and multi-layer laminates, illustrating a further embodiment of the present invention.

FIG. 6 shows another component 10" illustrating another embodiment of the present invention, wherein a masking material is applied at specific, designated locations 32 prior to electrodepositing an adhesion promoting layer 22" onto surface 12b of polyimide film 12. Following the deposition of the adhesion promoting layer 22", the masking material is etched away leaving exposed regions of surface 12b of polyimide film 12 at locations 32. Component 10" is suitable for use in circuit boards, wherein through hole locations within the boards are known, and locations 32 may be positioned accordingly.

Figure 8:
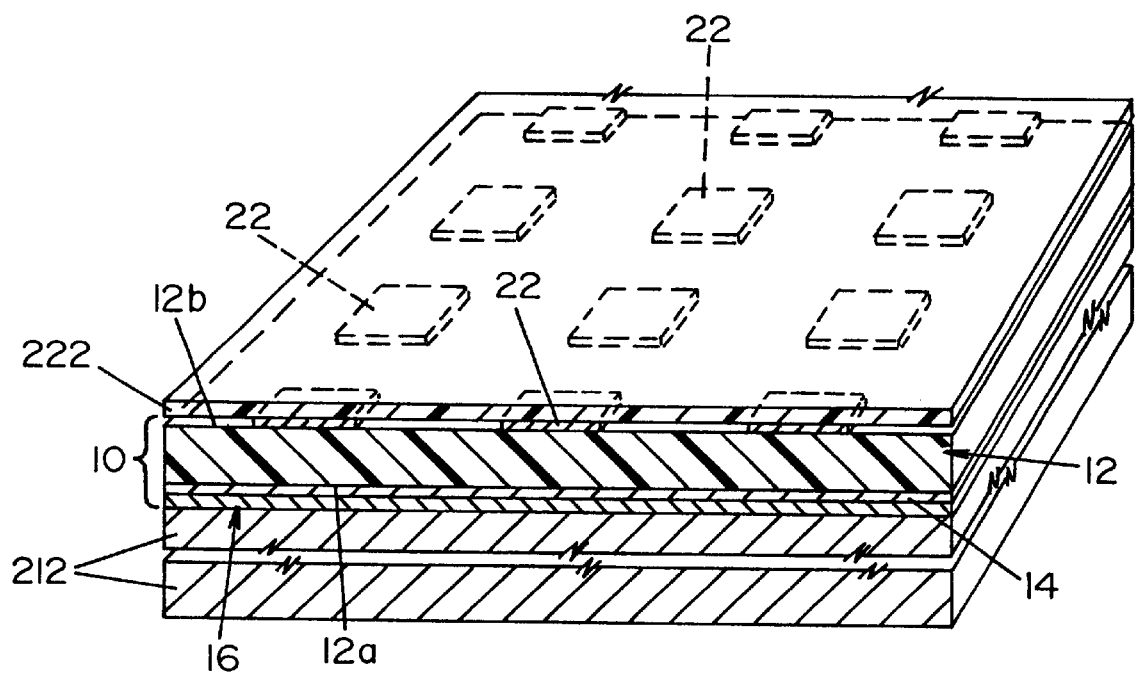
FIG. 8 is a perspective view showing a component for use in forming printed circuit boards and multi-layer laminates, illustrating another embodiment of the present invention.

As heretofore described, in its broadest embodiment, the present invention relates to a copper-on-polyimide component 10 having adhesion promoting areas 22 formed of a metal on the polyimide side thereof. Referring now to FIG. 8, another embodiment of the present invention is shown. FIG. 8 shows a component 10, as heretofore described, having a metallic support substrate 212 adhered to copper layer 16 along the periphery thereof. Support substrate 212 is provided as a protective layer to prevent contamination of copper layer 16, as disclosed in Assignee's co-pending U.S. patent application Ser. No. 09/397,404, entitled "Copper Coated Polyimide With Metallic Protective Layer," filed on Sep. 16, 1999, the disclosure of which is expressly incorporated herein by reference, and further to provide structural rigidity to component 10 to prevent excessive bending or flexing of component 10 and to prevent cracking or breaking of areas 22. FIG. 8 also shows an adhesive layer 222 formed of a dimensionally stable adhesive applied to component 10 over adhesion promoting areas 22. Adhesive layer 222 is provided for ready attachment of component 10 onto an inner core. Adhesive layer 222 is preferably formed of a dimensionally stable, uncured or semi-cured adhesive. A material available under the name "High Performance Epoxy Adhesive Bonding Film 9901/9902" manufactured by Minnesota Mining Manufacturing (3M) finds advantageous application to the present invention, and provides a dimensionally stable, uncured resin suitable for application in forming the component structures disclosed heretofore.

The present invention thus provides a component 10 for use in the manufacturing of printed circuit boards or other articles. Component 10 is basically a polymer-supported, thin layer of copper, i.e., comprised of polymeric film layer 12, tiecoat layer 14 and copper layer 16, having adhesion promoting areas 22 thereon. In use, polymeric film layer 12 is adapted to be attached to a core, with adhesion promoting areas 22 enhancing adhesion of film layer 12 to the core. Exposed, copper layer 16 is then utilized in either a subtractive process or a semi-additive process as described above to create a circuit pattern on polymeric film layer 12. As indicated above, the thickness of copper layer 16 formed on polymeric film layer 12 will vary depending upon the process used. Component 10 is thus suitable for various processes for forming printed circuits. Polymeric film layer 12 with an adhesion promoting material thereon provides a suitable surface for attachment to a dielectric substrate.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A component for use in manufacturing printed circuits that in a finished printed circuit constitutes a functional element, said component comprised of:

a film substrate formed of a first polymeric material having a first side and a second side;

at least one layer of a tiecoat metal applied to said first side of said film substrate;

at least one layer of copper on said at least one layer of a tiecoat metal, said layer of copper having an essentially uncontaminated exposed surface facing away from said at least one layer of tiecoat metal; and a plurality of spaced apart, discrete, adhesion promoting areas formed of a tiecoat metal on said second side of said film substrate, said adhesion promoting areas defining regions of exposed polymeric material on said second side of said film substrate.

2. A component as defined in claim 1, wherein said first polymeric material is polyimide.

3. A component as defined in claim 2, wherein said adhesion promoting areas define a continuous region of exposed polymeric material.

4. A component as defined in claim 2, wherein said tiecoat metal is selected from the group consisting of chromium, nickel, titanium, aluminum, molybdenum, tantalum, gold, tin, indium, vanadium, silicon, iron, copper and alloys thereof.

5. A component as defined in claim 4, wherein said tiecoat has a thickness of between 0 Å and about 500 Å.

6. A component as defined in claim 5, wherein said copper layer has a thickness between about 0.1 $\mu$m and about 70 $\mu$m.

7. A component as defined in claim 6, wherein said copper layer has a thickness of about 0.2 $\mu$m.

8. A component as defined in claim 6, wherein said polyimide film has a thickness of between about 12.5 $\mu$m and about 125 $\mu$m.

9. A component as defined in claim 1, wherein said first polymeric material is a polyimide, and said component is further comprised of a dimensionally stable adhesive film applied to said second side of said film substrate.

10. A component as defined in claim 9, wherein said adhesive is selected from the group consisting of acrylics, epoxies, nitrile rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof.

11. A component as defined in claim 10, wherein said adhesive film is an epoxy having a thickness between about 1 mil to about 3 mils.

12. A component as defined in claim 9, further comprising a metal support substrate that constitutes a discardable element in the formation of a printed circuit board, one surface of said metal support substrate being essentially uncontaminated and engageable with said layer of copper, said support substrate attached to said layer of copper at its periphery to define a substantially uncontaminated central zone of copper inwardly of the edges of the copper layer.

13. A component for use in manufacturing printed circuits that in a finished printed circuit constitutes a functional element, said component comprised of:

a film substrate formed of a first polymeric material having a first side and a second side;

at least one layer of a tiecoat metal applied to said first side of said film substrate;

at least one layer of copper on said at least one layer of a tiecoat metal, said layer of copper having an essentially uncontaminated exposed surface facing away from said at least one layer of tiecoat metal; and a plurality of spaced apart, discrete, adhesion promoting areas formed of a tiecoat metal on said second side of said film substrate, said adhesion promoting areas defining regions of exposed polymeric material on said second side of said film substrate;

an uncured adhesive on said second side of said film substrate; and a metal support substrate that constitutes a discardable element in the formation of a printed circuit board, one surface of said metal support substrate being essentially uncontaminated and engageable with said layer of copper, said support substrate attached to said layer of copper at its periphery to define a substantially uncontaminated central zone of copper inwardly of the edges of the copper layer.

\* \* \* \* \*